United States Patent
Su et al.

(10) Patent No.: US 7,597,787 B2
(45) Date of Patent: Oct. 6, 2009

(54) METHODS AND APPARATUSES FOR ELECTROCHEMICAL DEPOSITION

(75) Inventors: Hung-Wen Su, Jhubei (TW); Ming-Hsing Tsai, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 733 days.

(21) Appl. No.: 11/072,137

(22) Filed: Mar. 4, 2005

(65) Prior Publication Data
US 2006/0196775 A1    Sep. 7, 2006

(51) Int. Cl.
*C25D 3/06* (2006.01)

(52) U.S. Cl. ............... 204/288.2; 204/280; 204/297.01; 205/147

(58) Field of Classification Search ............ 205/147; 204/280, 297.01, 198, 286.1, 287, 288.2
See application file for complete search history.

(56) References Cited

U.S. PATENT DOCUMENTS

| | | | |
|---|---|---|---|
| 4,158,612 A * | 6/1979 | Luch et al. ............ 205/67 |
| 4,240,894 A * | 12/1980 | Adler ............ 204/281 |
| 4,502,929 A * | 3/1985 | Stewart et al. ............ 205/734 |
| 5,480,528 A * | 1/1996 | Bischoping et al. ......... 204/212 |
| 6,444,101 B1 * | 9/2002 | Stevens et al. .......... 204/224 R |
| 6,635,157 B2 | 10/2003 | Dordi et al. ............ 204/198 |
| 2005/0056544 A1 * | 3/2005 | Liu et al. ............ 205/223 |

* cited by examiner

*Primary Examiner*—Nam X Nguyen
*Assistant Examiner*—Luan V Van
(74) *Attorney, Agent, or Firm*—Thomas, Kayden, Horstemeyer & Risley (57) ABSTRACT

Methods and apparatuses for electrochemically depositing a metal layer onto a substrate. An electrochemical deposition apparatus comprises a substrate holder assembly including a substrate chuck and a relatively soft cathode contact ring. The cathode contact ring comprises an inner portion and an outer portion, wherein the inner portion directly contacts the substrate. An anode is disposed in an electrolyte container. A power supply connects the substrate holder assembly and the anode.

8 Claims, 10 Drawing Sheets

METHODS AND APPARATUSES FOR ELECTROCHEMICAL DEPOSITION

BACKGROUND

The invention relates to methods and apparatuses for fabricating a metal layer on a substrate, and more particularly, to methods and apparatuses for depositing a metal layer on a substrate using electrochemical deposition (ECD).

Conventionally, conductive interconnections on integrated circuits take the form of trenches and vias. In modern deep submicron integrated circuits, the trenches and vias are typically formed by a damascene or dual damascene process. Copper is currently used in ultra large scale integration (ULSI) metallization as a replacement for aluminum due to its lower resistivity and better electromigration resistance. Electrochemical deposition (ECD) has been adopted as the standard damascene or dual damascene process because of larger grain size (good electromigration) and higher deposition rates. More particularly, electroplating is well suited for the formation of small embedded damascene feature metallization due to its ability to readily control growth of the electroplated film for bottom-up filling, and the superior electrical conductivity characteristics of the electroplated film.

Figure 1:
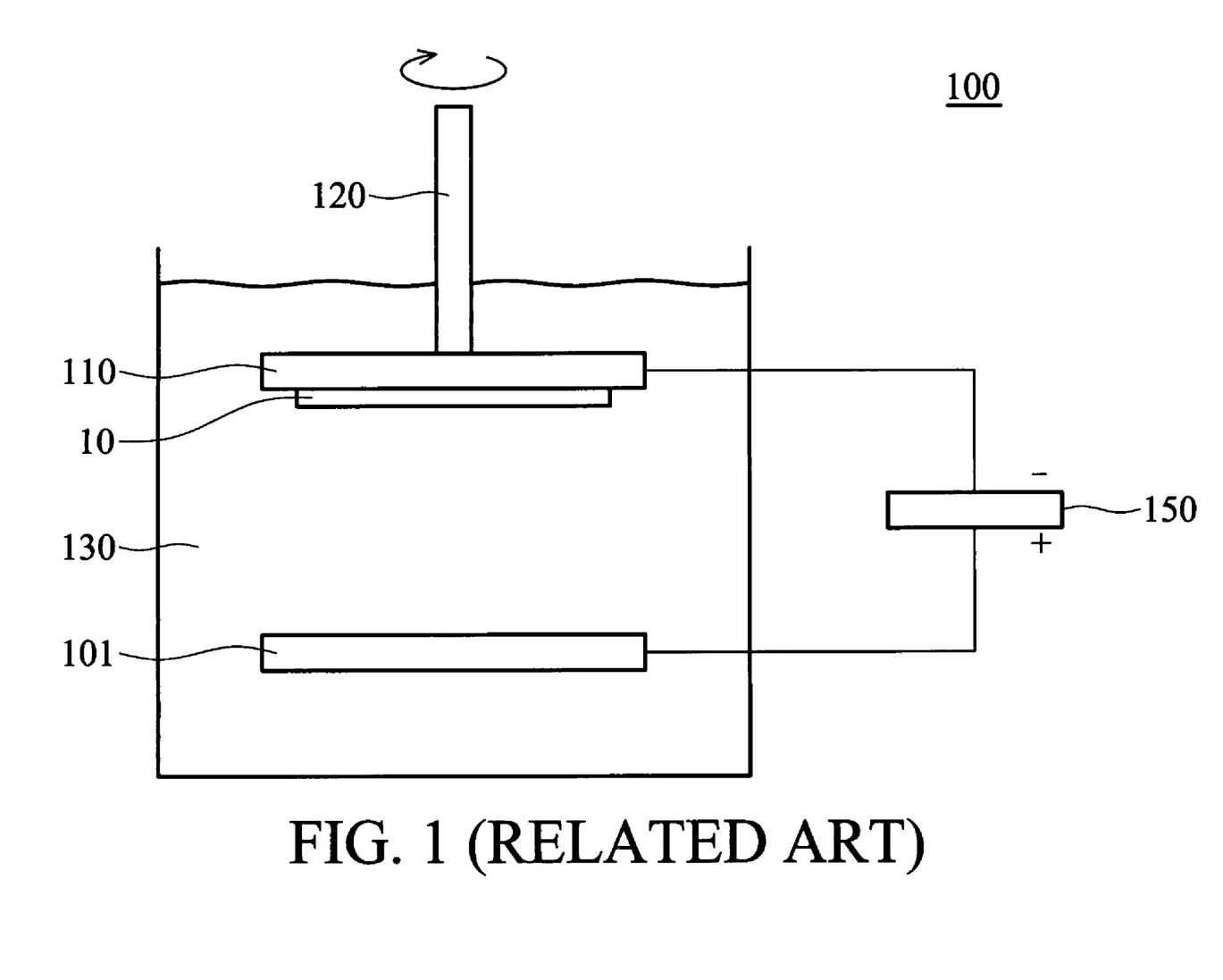
FIG. 1 is schematic view of a conventional electrochemical plating process apparatus.

FIG. 1 is a schematic view of a conventional apparatus for electrochemical plating 100, with a wafer 10 mounted onto a substrate holder assembly 110. The substrate holder assembly 110 is mounted on a rotatable spindle 120 which allows rotation thereof.

During electrochemical plating, the substrate holder assembly 110 as well as the wafer 10 are placed in a plating bath 130 containing plating solution. Typical electroplating solution contains electrolyte, such as $CuSO_4$ and other additives.

A DC power supply 150 has a negative output lead electrically connected to wafer 10 through one or more contact rings (not shown). The positive output lead of power supply 150 is electrically connected to an anode 101 located in the plating bath 130. During electroplating, power supply 150 biases the wafer 10 to provide a negative potential relative to the anode 101 causing electrical current to flow from the anode 101 to the wafer 10. This causes an electrochemical reaction (e.g. $Cu^{2+}+2e^-=Cu$) on the wafer 10 which results in deposition of the electrically conductive layer (e.g. copper) on the wafer 10. The ion concentration of the plating solution is replenished during the plating cycle, for example by dissolution of a metallic anode (e.g. $Cu=Cu^{2+}+2e^-$).

Figure 2:
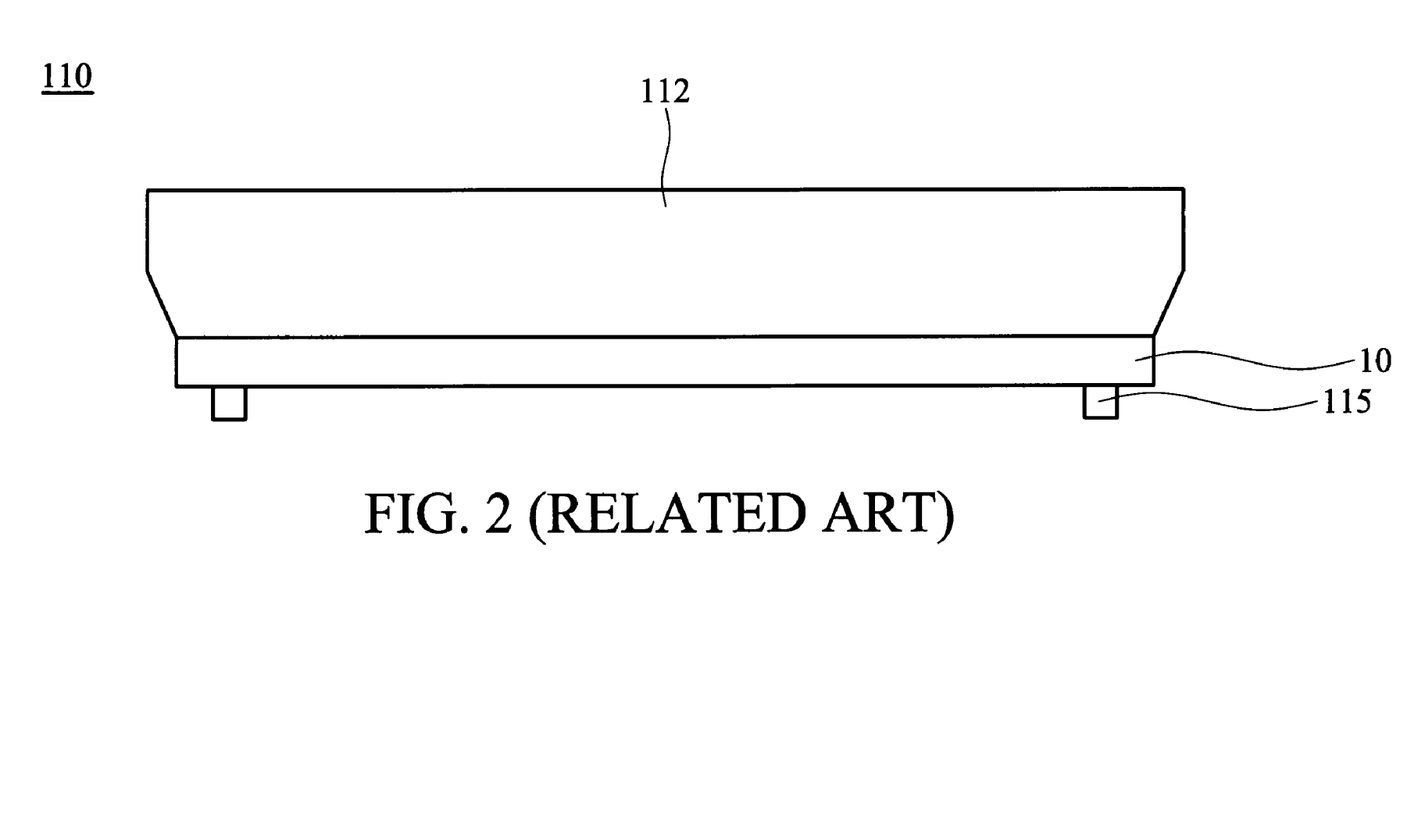
FIG. 2 is a cross-section of a conventional substrate holder assembly of the electrochemical plating process apparatus of FIG. 1.

Referring to FIG. 2, a conventional substrate holder assembly 110 comprises a substrate chuck 112 with the wafer 10 mounted thereon. A cathode contact ring 115, typically formed of metal such as platinum, electrically connects the wafer 10 to render a negative potential relative to the anode (not shown) causing electrical current to flow from the anode to the wafer 10.

Figure 3A:
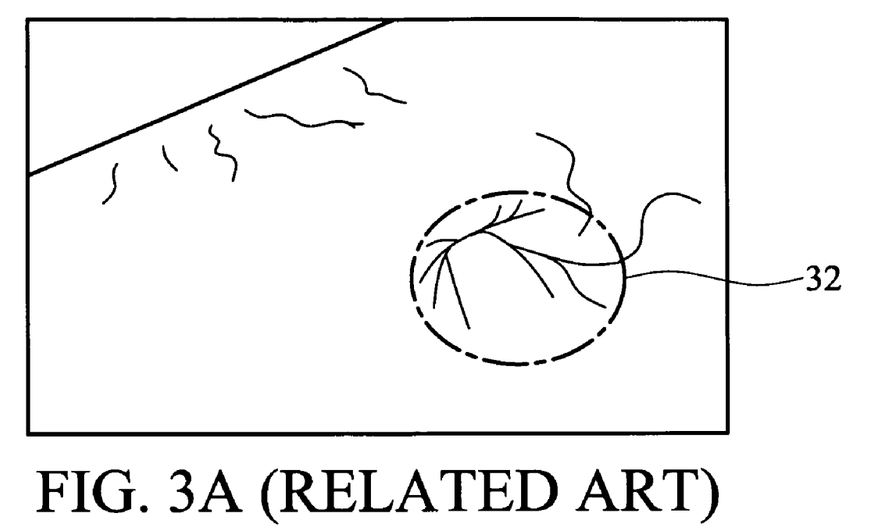
FIGS. 3A and 3B are schematic diagrams showing the low-k dielectric layer cracks and peeling defects after CMP.
Figure 3B:
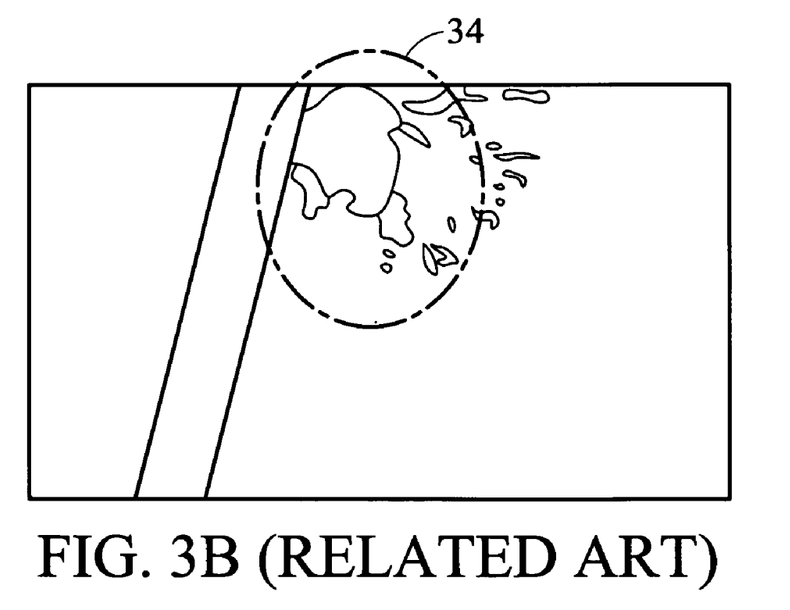

However, since the cathode contact ring 115 is solid, under layers, such as a low-k dielectric layer, can tend to exhibit cracking 32 (FIG. 3A) and peeling 34 (FIG. 3B) after chemical mechanical polishing (CMP).

U.S. Pat. No. 6,635,157 (Dordi et. al.), the entirety of which is hereby incorporated by reference, describes a bladder assembly that provides pressure to the backside of a wafer and ensures electrical contact between the wafer plating surface and the cathode contact ring. However, the pressure between the electrical contact ring and the wafer plating surface are still quite large, and can cause cracking and peeling in the low-k dielectric layer.

SUMMARY

Embodiments of the invention are directed to methods and apparatuses for fabricating a metal layer on a substrate using electrochemical deposition (ECD).

An exemplary embodiment of an apparatus for electrochemical depositing a metal layer onto a substrate is provided comprising: a substrate holder assembly including a substrate chuck, and a relatively soft cathode contact ring, the cathode contact ring having an inner portion and an outer portion; an electrolyte container; an anode disposed in the electrolyte container; and a power supply connecting the substrate holder assembly and the anode.

Another exemplary embodiment of an apparatus for electrochemical depositing a metal layer onto a substrate is provided comprising: a substrate holder assembly including a substrate chuck and a relatively soft cathode contact ring with an inner portion encapsulated by an outer portion, the inner portion conformably contacting an electroplating surface of a substrate; an electrolyte container; an anode disposed in the electrolyte container; and a power supply connected to the cathode and the anode.

An embodiment of a method for fabricating a metal layer on a substrate using electrochemical deposition (ECD), comprising: providing a substrate having a barrier layer and a seed layer thereon; conformably contacting the substrate with a soft cathode contact ring; and electrochemically depositing a metal layer on the substrate in an electrochemical plating cell, wherein the cathode contact ring with an inner portion encapsulated by an outer portion.

DESCRIPTION OF THE DRAWINGS

Methods and apparatuses for fabricating a metal layer on a substrate will become more fully understood from the detailed description given hereinafter and the accompanying drawings which are given by way of illustration only, and thus are not limitation of the invention, and wherein.

DETAILED DESCRIPTION

Methods and apparatuses for electro-chemically depositing a metal layer onto a substrate are provided. It is noted that in the accompanying drawings, like and/or corresponding elements are referred to by like reference numerals.

Figure 4:
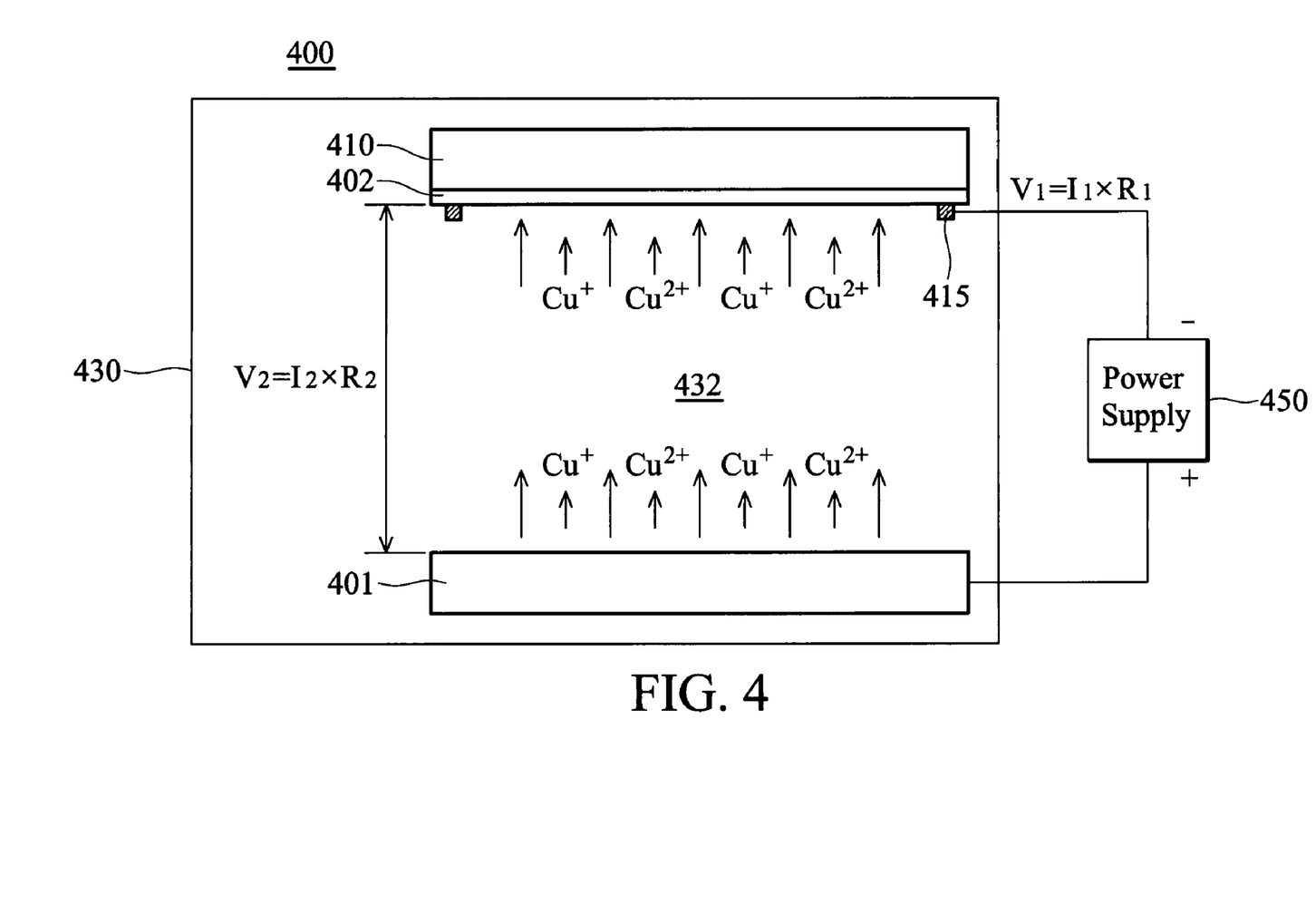
FIG. 4 is a schematic view of an electroplating apparatus according to an embodiment of the invention.

FIG. 4 is a schematic view of an electrochemical plating process apparatus 400, with a wafer 402 mounted onto a substrate holder assembly 410. The substrate holder assembly 410 comprises a substrate chuck 412 (shown in FIG. 5) and a cathode contact ring 415. An anode 401 is disposed in an electrolyte container 430. A cathode electrical contact ring 415 contacts the plating surface of the substrate 402. A power supply 450 connects the cathode electrical contact ring 415 and the anode 401.

During electrochemical plating, the substrate holder assembly 410 as well as the wafer 402 are placed in an electrolyte container 430 containing plating solution 432. Typical electroplating solution contains electrolyte, such as $CuSO_4$ and other additives.

The DC power supply 450 has a negative output lead electrically connected to wafer 402 through cathode electrical contact ring 415. The positive output lead of power supply 450 is electrically connected to an anode 401 located in the plating bath. During electroplating, power supply 450 biases the wafer 402 to provide a negative potential relative to the anode 401 causing electrical current to flow from the anode 401 to the wafer 402. (As used herein, electrical current flows in the same direction as the net positive ion flux and opposite to the net electron flux.) This causes an electrochemical reaction (e.g. $Cu^{2+}+2e^-=Cu$ or $Cu^++e^-=Cu$) on the wafer 402 which results in deposition of the electrically conductive layer (e.g. copper) on the wafer 402. The ion concentration of the plating solution is replenished during the plating cycle, for example by dissolution of a metallic anode (e.g. $Cu=Cu^{2+}+2e^-$ or $Cu=Cu^++e^-$).

The resistance $R_2$ between the anode and the plating surface of the substrate 402 is approximately equal to the resistance of plating solution, which is approximately $1.5\Omega$. The resistance $R_2$ of the cathode contact ring is preferably less than $2.5 E-7\Omega$.

Figure 5:
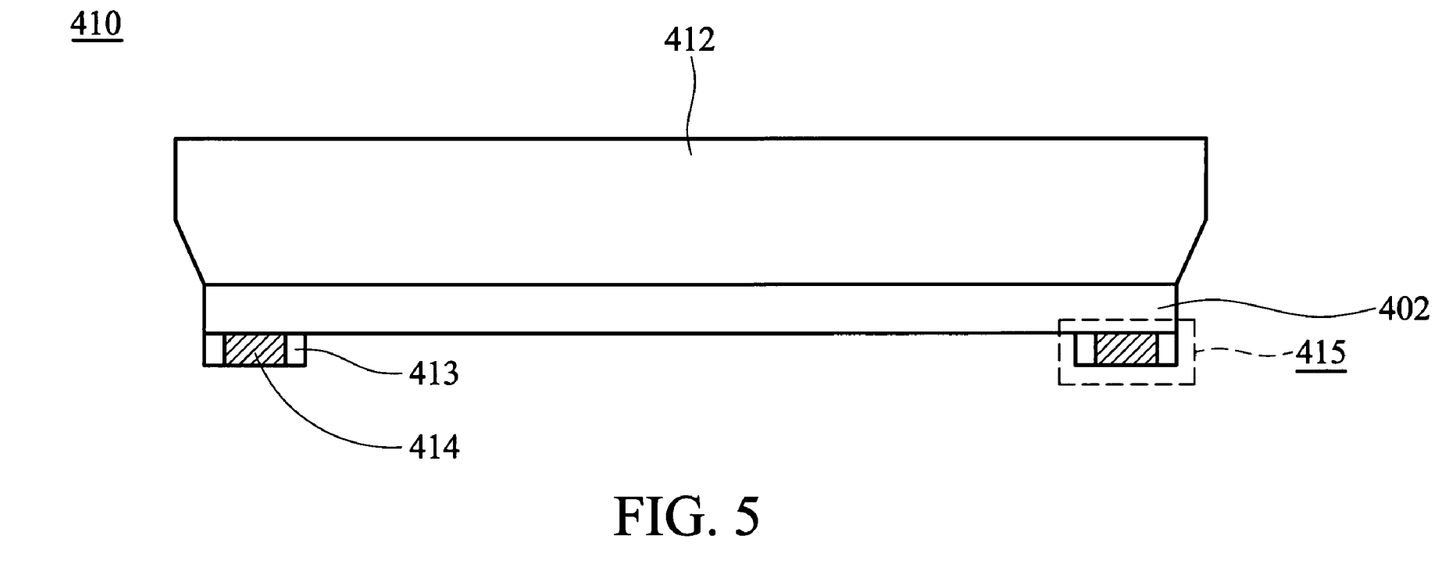
FIG. 5 is a cross-section of a substrate holder assembly of the electrochemical plating process apparatus of FIG. 4.

Accordingly, a relatively soft contact between the electrical contact ring and the wafer plating surface is desirable to ameliorate the low-k dielectric layer cracking and peeling problems. FIG. 5 is an exemplary embodiment of the substrate holder assembly 410 comprises a substrate chuck 412 with substrate 402 mounted thereon. A cathode contact ring 415 electrically connects to the wafer 402 to render a negative potential relative to the anode (not shown) causing electrical current to flow from the anode to the wafer 402.

Figure 6:
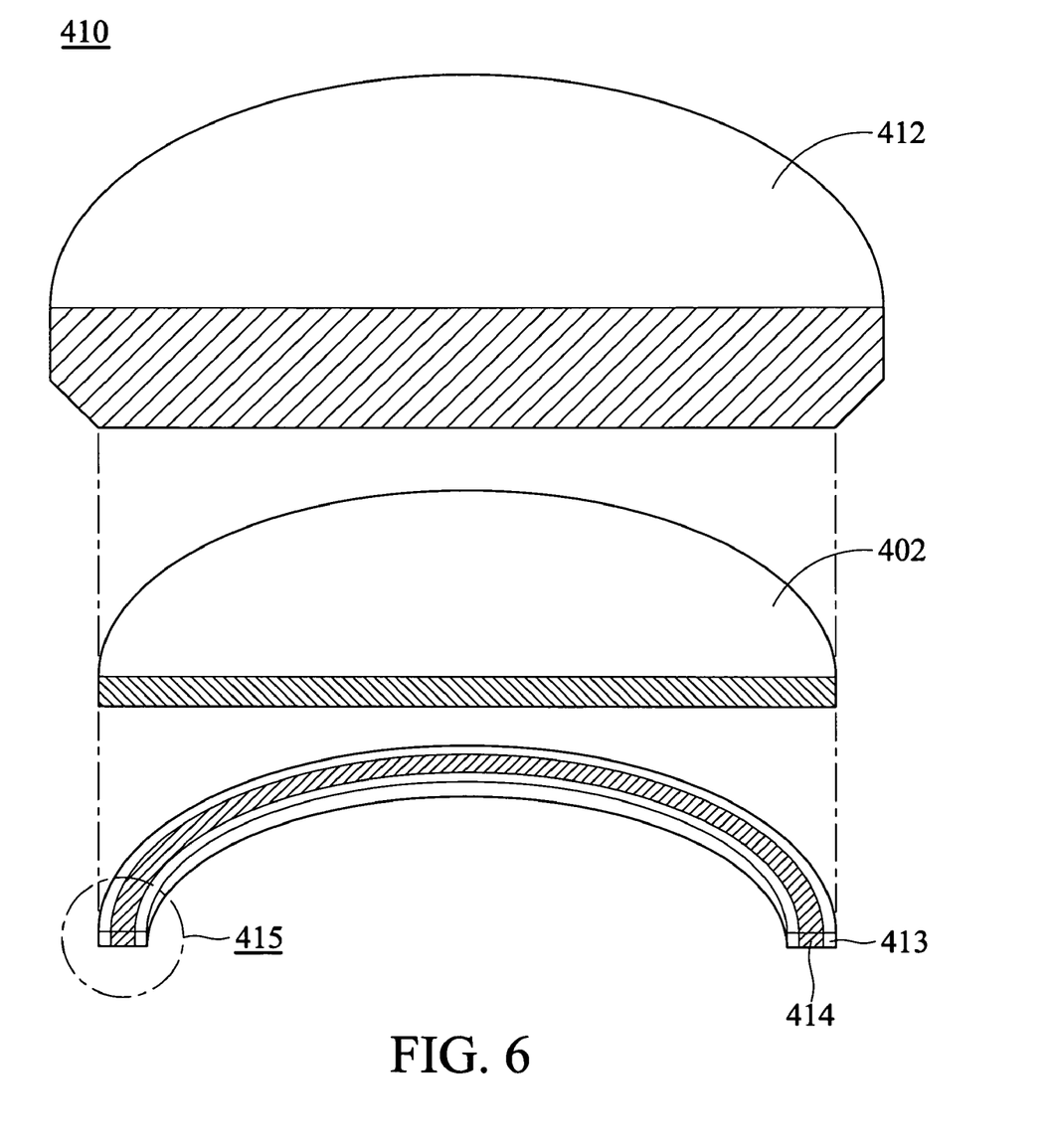
FIG. 6 is an explosive view of a substrate holder assembly of the electrochemical plating apparatus of FIG. 5.
Figure 7A:
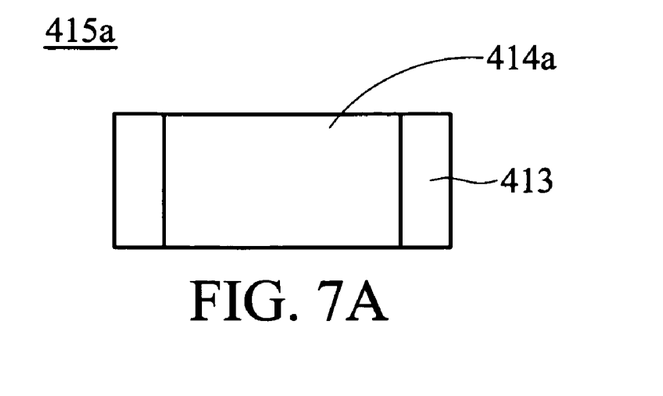
FIGS. 7A-7C are cross sections of various of exemplary embodiments of the cathode contact rings.
Figure 7B:
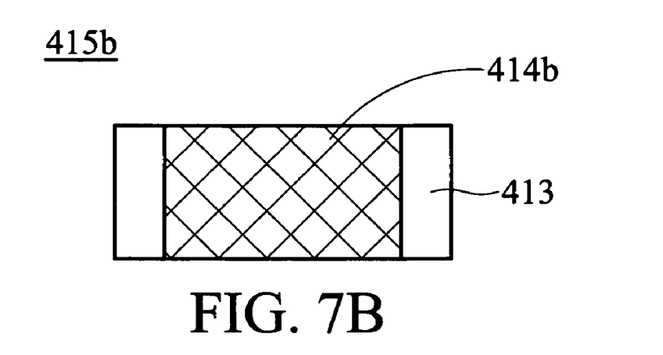
Figure 7C:
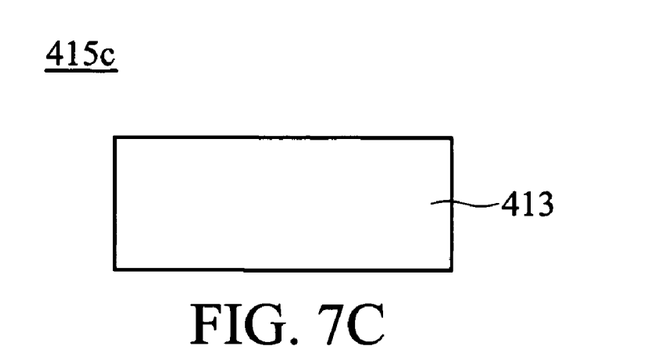

FIG. 6 is an explosive view of a substrate holder assembly of the electrochemical plating apparatus of FIG. 5. The substrate 402 is mounted on the substrate chuck 412 by vacuum sucking or binding. The cathode contact ring 415 electrically contacts peripheral region of the plating surface of the substrate 402. The cathode contact ring 415 comprises for example two layers contact ring with an inner ring 414 encapsulated by an outer ring 413, wherein the inner ring 414 directly contacts the plating surface of the substrate 402. The resistivity of the inner ring 414 is preferably equal to or less than 1000 $\mu\Omega \cdot cm$. The width of the inner ring 414 is equal to or less than about 1 mm and the height of the inner ring 414 is equal to or less than about 0.5 mm. The inner portion 414a of the cathode contact ring 415a can comprise air and the outer portion 413 of the cathode contact ring 415a can comprise conductive polymer, as shown in FIG. 7A. Alternatively, the inner portion 414 of the cathode contact ring 415b can comprise mercury, KCl solution, or other electrolytes. The outer portion 413 of the cathode contact ring 415b can comprise polymer or silicone, as shown in FIG. 7B. Alternatively, the cathode contact ring 415c can comprise solid conductive polymer 413, as shown in FIG. 7C.

Figure 8:
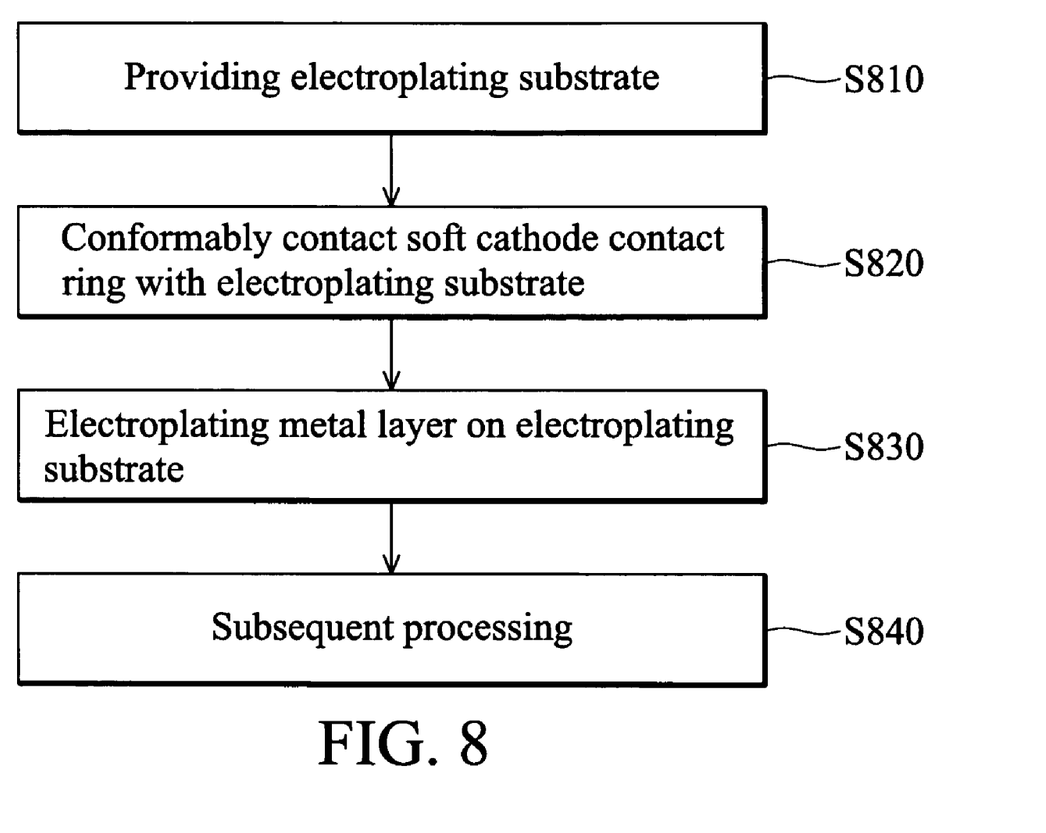
FIG. 8 is a flow chart of a metallization technique electrochemically plating a metal layer on a substrate according to embodiments of the invention.

FIG. 8 is a flow chart of a metallization technique electrochemically plating a metal layer on a substrate according to embodiments of the invention. First, an electroplating substrate is provided (S610) including those outlining the interconnect structure. A barrier/seed layer (not shown) can be deposited using chemical vapor deposition (CVD) or physical vapor deposition (PVD). High conductance barrier/seed layer includes a high conductance material such as tungsten, tungsten nitride, titanium and titanium nitride, copper or combinations thereof.

Subsequently, a cathode contact ring is conformably positioned in contact with the electroplating substrate (820). The cathode contact ring 415 electrically contacts peripheral region of the plating surface of the substrate 402. The cathode contact ring 415 comprises for example two layers contact ring with an inner ring 414 encapsulated by an outer ring 413, wherein the inner ring 414 directly contacts the plating surface of the substrate 402. The resistivity of the inner ring 414 is preferably equal to or less than 1000 $\mu\Omega \cdot cm$. The width of the inner ring 414 is equal to or less than about 1 mm and the height of the inner ring 414 is equal to or less than about 0.5 mm. The inner portion 414a of the contact ring comprises air and the outer contact ring 413 comprises conductive polymer, as shown in FIG. 7A. Alternatively, the inner ring 414 comprises mercury, KCl solution, or other electrolytes. The outer ring 413 comprises polymer or silicone, as shown in FIG. 7B. Alternatively, the cathode contact ring 415 comprises solid conductive polymer, as shown in FIG. 7C.

A metal layer is electroplated on the electroplating surface of the substrate (830). The metal layer may comprise for example copper. After metallization, the substrate is subsequently processed such as planarized to complete interconnection fabrication.

FIGS. 9A-9E are metallization of forming interconnect features in a multi-layered substrate using soft cathode contact rings during electrochemical plating. Generally, the method includes physical vapor deposition of barrier layer over the feature surfaces, physical vapor deposition of a conductive metal seed layer, preferably copper, over the barrier layer, and then electrochemically plating a conductive metal, preferably copper, over seed layer filling interconnect structures/features. During plating, a soft-cathode contact ring is used comfortably contacting the plating surface (step 820). Finally, the deposited layers and the dielectric layers are planarized, such as by chemical mechanical polishing (CMP), to define a conductive interconnect feature.

Figure 9A:
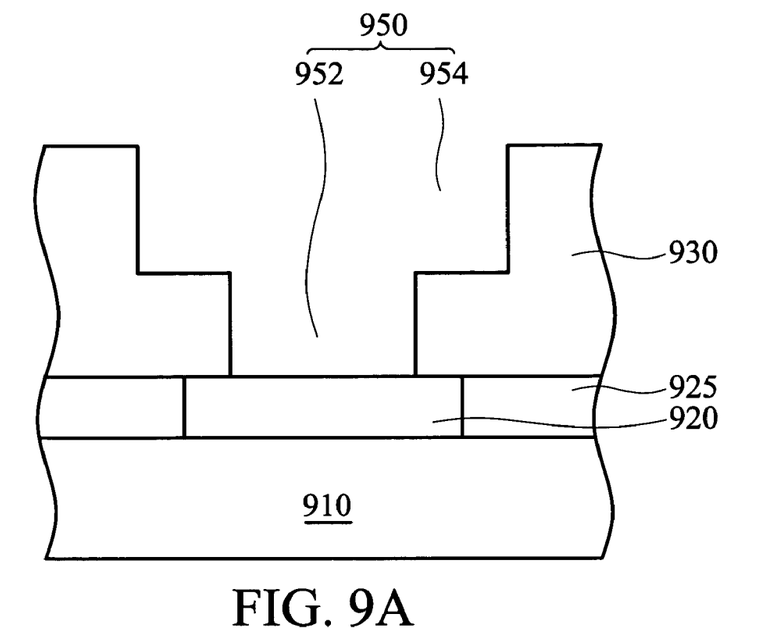
FIGS. 9A-9D are cross-sections of dual damascene interconnect lines during various stages of an embodiment of a fabrication process.
Figure 9B:
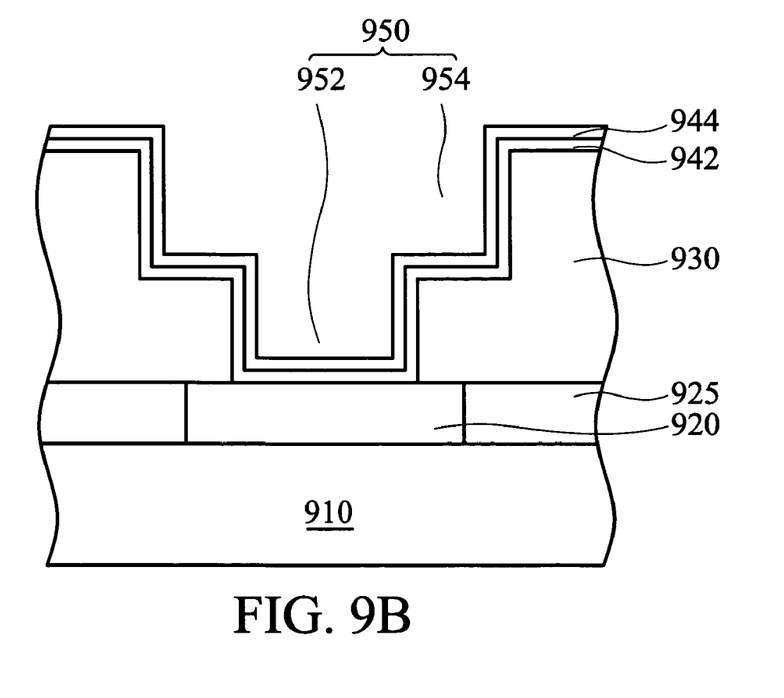

Referring to FIG. 9A, a semiconductor substrate 910 is provided. A copper metal interconnect 920 is shown patterned within an insulating layer 925, such as silicon oxide or low-k dielectric materials. In addition, a dielectric layer 930 is deposited and patterned with a via portion 952 and a trench portion 954. Referring to FIG. 9B, a barrier layer 942, preferably including tantalum (Ta) or tantalum nitride (TaN), is deposited over the surface of the dielectric 930, including the surfaces of the via portion 952 and the trench portion 954. The barrier layer 942 is typically deposited using physical vapor deposition (PVD) by sputtering or reactive PVD. The barrier layer 942 limits the diffusion of copper into the semiconductor substrate and the dielectric layer, thereby dramatically increasing reliability. For a high conductance barrier layer including tantalum, the barrier layer is preferably deposited at low temperature (<350° C.) PVD and then annealed at between approximately 350° C. to 600° C., or deposited by PVD at between approximately 350° C. to 600° C. Preferably, a barrier layer has a film thickness between approximately 250 and 500 Å for interconnect structures/features having sub-micron opening width. It is preferred that the barrier layer has a thickness between approximately 50 and 300 Å.

A copper seed layer 944 is deposited over the barrier layer 942 using PVD. The copper seed layer 944 provides good adhesion for subsequent electroplating of copper. It is preferred that the seed layer have a thickness between approximately 500 and 2000 Å.

Figure 9C:
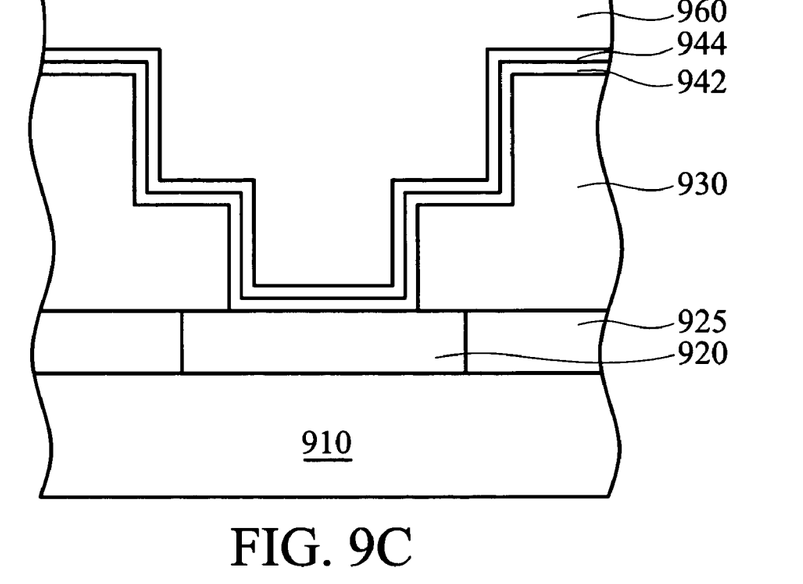

Referring to FIG. 9C, a copper layer 960 is electroplated over the copper seed layer 944 to metallize the dual damascene structure. A soft cathode contact ring is used comfortably contacting the plating surface. The cathode contact ring comprises an inner ring encapsulated by an outer ring. In a preferred embodiment of the present invention, the resistivity of the inner ring is preferably equal to or less than 1000 $\mu\Omega\cdot cm$. The width of the inner ring is equal to or less than about 1 mm and the height of the inner ring is equal to or less than about 0.5 mm. The inner ring comprises mercury, KCl solution, or other electrolytes. The outer ring comprises polymer, or silicone.

Figure 9D:
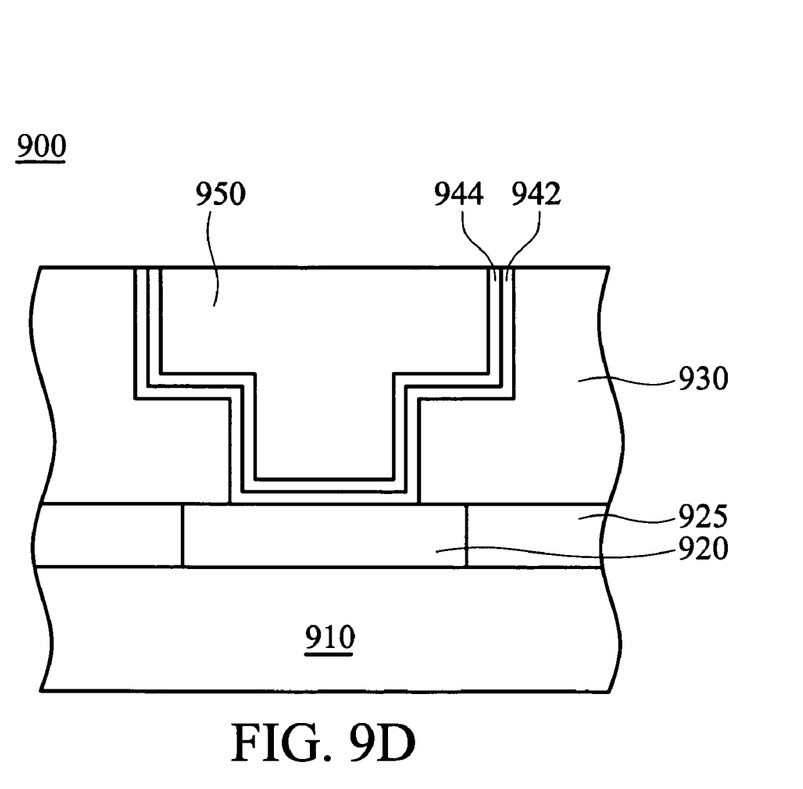

Referring to FIG. 9D, the top portion of the processed substrate, i.e., the exposed electroplated copper layer 960 (shown in FIG. 9C), is then planarized, preferably by chemical mechanical polishing (CMP). During the planarization process, portions of the copper layer 960, copper seed layer 944, barrier layer 942, and a top surface of the dielectric layer 930 are removed from the top surface of the substrate, leaving a fully planar surface with conductive interconnect features, such as a dual damascene structure 900.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for electrochemical depositing a metal layer onto a substrate, comprising:
    a substrate holder assembly including a substrate chuck, and a relatively soft cathode contact ring, the cathode contact ring having an inner conductive liquid portion and an outer polymer portion, wherein the inner conductive liquid portion of the cathode contact ring comprises mercury or KCl solution;
    an electrolyte container;
    an anode disposed in the electrolyte container; and
    a power supply connecting the substrate holder assembly and the anode.

2. The apparatus according to claim 1, wherein the cathode contact ring conformably contacts an electroplating surface.

3. The apparatus according to claim 1, wherein the resistance between the anode and the cathode contact ring is equal to or less than about 1.485Ω.

4. An apparatus for electrochemical depositing a metal layer onto a substrate, comprising:
    a substrate holder assembly including a substrate chuck and a relatively soft cathode contact ring with an inner conductive liquid portion encapsulated by an outer polymer portion, the inner conductive liquid portion conformably contacting an electroplating surface of a substrate, wherein the inner conductive liquid portion of the cathode contact ring comprises mercury or KCl solution;
    an electrolyte container;
    an anode disposed in the electrolyte container; and
    a power supply connected to the cathode and the anode.

5. The apparatus according to claim 4, wherein the width of the inner conductive liquid portion of the contact ring is equal to or less than about 1 mm and the height of the inner ring is equal to or less than about 0.5 mm.

6. The apparatus according to claim 4, wherein the resistance between the anode and the cathode contact ring is equal to or less than about 1.485Ω.

7. A method of electrochemical deposition comprising:
    providing a substrate having a barrier layer and a seed layer thereon;
    conformably contacting the substrate with a soft cathode contact ring; and
    electrochemically depositing a metal layer on the substrate in an electrochemical plating cell, wherein the cathode contact having an inner conductive liquid portion is encapsulated by an outer polymer portion, and wherein the inner conductive liquid portion of the cathode contact ring comprises mercury or KCl solution.

8. The method according to claim 7, wherein the width of the inner conductive liquid portion of the cathode contact ring is equal to or less than about 1 mm and the height of the inner ring is equal to or less than about 0.5 mm.

* * * * *